United States Patent [19]

Yoshitome et al.

[11] Patent Number: 4,894,616
[45] Date of Patent: Jan. 16, 1990

[54] SELECTIVE EXCITATION METHOD FOR NMR IMAGING

[75] Inventors: Eiji Yoshitome; Kazuya Hoshino; Susumu Kosugi, all of Tokyo, Japan

[73] Assignee: Yokogawa Medical Systems, Limited, Tokyo, Japan

[21] Appl. No.: 251,213

[22] PCT Filed: Mar. 6, 1987

[86] PCT No.: PCT/JP87/00141
§ 371 Date: Sep. 27, 1988
§ 102(e) Date: Sep. 27, 1988

[87] PCT Pub. No.: WO87/05201
PCT Pub. Date: Sep. 11, 1987

[30] Foreign Application Priority Data
Mar. 7, 1986 [JP] Japan .................................. 86/50143

[51] Int. Cl.[4] ........................................... G01R 33/20
[52] U.S. Cl. .................................................... 324/309
[58] Field of Search ............... 324/300, 307, 309, 311, 324/312, 313, 314

[56] References Cited
U.S. PATENT DOCUMENTS

| 4,535,290 | 8/1985 | Post et al. | 324/309 |
| 4,558,277 | 12/1985 | Post et al. | 324/309 |
| 4,733,182 | 3/1988 | Clarke | 324/301 |
| 4,737,714 | 4/1988 | Hanawa | 324/309 |

Primary Examiner—Michael J. Tokar
Attorney, Agent, or Firm—Moonray Kojima

[57] ABSTRACT

An improved selective excitation method applicable to NMR imaging, regardless of the NMR signal generation method used, wherein a non-scanned subject area is excited using an RF signal, then the excited area is spoiled with a gradient magnetic field to create an area that receives no other excitation RF signal for a set period, and then NMR signals are collected from the unspoiled area using a conventional method.

3 Claims, 5 Drawing Sheets

SELECTIVE EXCITATION METHOD FOR NMR IMAGING

TECHNICAL FIELD

This invention relates to an improved selective excitation method of collecting data for NMR imaging that reconfigures a sectional image of a subject using scan data based on a nuclear magnetic resonance phenomenon collected from the subject.

BACKGROUND ART

Various selective excitation methods have already been developed. One method disclosed by Patent Disclosure No. Showa 60(1985)-185149 sets the selective excitation pulse sequence in two directions (x and y) as shown in FIG. 6. In other words, positional selection gradient magnetic field $G_x$ is applied in the first direction or direction x (slice axis) for example. Then a selective excitation of spin is effected by applying a RF pulse 90° to the first direction (90° excitation RF signal). Then after applying a spin warp in the second direction specified in an area that orthogonally intersects the first direction or in direction y (warp axis) for example, and applying positional selection gradient magnetic field $G_y$, a selective inversion of spin is effected by applying an RF pulse 180° in the second direction (180° excitation RF signal). Then a spin echo signal is received by applying readout gradient magnetic field $G_z$ in the third direction that orthogonally intersects the first and second directions, respectively, or direction z (read axis). As a result, a spin echo signal in an area of delta x in thickness and delta y (width) in both directions (x and y) can be obtained.

There are methods for generating NMR signals other than that mentioned above. For example, there is a method by which a spin echo signal is generated by inverting a gradient magnetic field after exciting it by applying a 90° RF pulse. There is another method by which a Free Induction Decay (FID) signal (generated immediately after 90° RF pulse excitation) is used as the NMR signal. Because these methods use a 90° RF pulse instead of a 180° RF pulse for excitation, a selective excitation method using both types of excitation signals (90° and 180° RF pulse signals) in both directions (x and y) cannot be adopted. If selective excitation cannot be effected in two directions, a turn is made in the directions where there is no selectivity, and aliasing artifacts are created as shown in FIG. 7 if a measured NMR signal is used as a raw data for reconfiguring an image under Fourier transformation.

DISCLOSURE OF INVENTION

The object of this invention is to provide a selective excitation method applicable to NMR imaging, regardless of the NMR signal generation method used.

To apply our invention in the most preferred mode, we utilized a selective excitation method for NMR imaging that, after exciting a subject area other than that used for scanning with an RF signal and spoiling the excited area with a gradient magnetic field, creates an area that receives no other excitation RF signals. NMR signals are collected from unspoiled areas according to the conventional method.

BEST MODE FOR CARRYING OUT THE INVENTION

Figure 1:
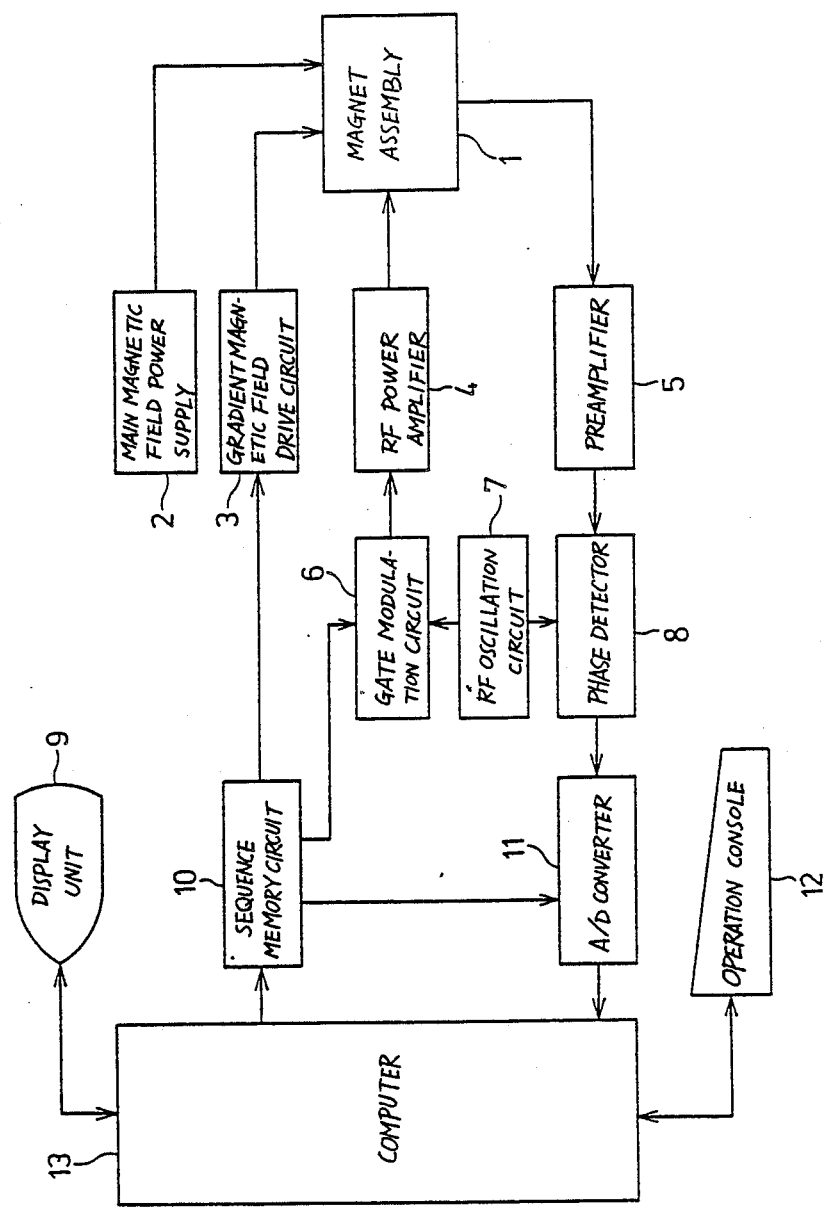
FIG. 1 shows the block diagram of an NMR imaging device to which the preferred application mode according to the excitation method provided by this invention is applied.

An example of the preferred application mode of this invention is described in detail by referring to the drawings as follows.

In FIG. 1, "1" indicates a magnet assembly having an inner space section for inserting a subject. The space section is surrounded by a static magnetic field coil that applies a constant static magnetic field to a subject, gradient magnetic field coils (x, y, and z) for generating a gradient magnetic field, an RF transmission coil for providing high-frequency pulses to excite the spinning of specified nucleuses inside the body system of the subject, and a receiving coil for detecting NMR signals sent from the subject (diagram omitted). The static magnetic field coil, gradient magnetic field coil, RF transmission coil, and receiving coil are respectively connected to main static magnetic field power supply 2, gradient magnetic field drive circuit 3, RF power amplifier 4 and preamplifier 5. Sequence memory circuit 10 operates gradient magnetic field drive circuit 3 and gate modulation circuit 6 according to instructions issued by computer 13, and generates the gradient magnetic field and high frequency pulse signal in the preferred application mode according to the method provided by this invention. Sequence memory circuit 10 also operates gradient magnetic field drive circuit 3, gate modulation circuit 6 and A/D converter 11 according to sequence based, for example, on the Fourier method. Phase detector 8 uses the output from RF oscillation circuit 7 as a reference signal to detect the phase of an NMR signal (detected by the receiving coil and sent by preamplifier 5), then send the data to A/D converter 11. A/D converter 11 executes A/D conversion of the NMR signal obtained through phase detector 8, then sends the result to computer 13.

To exchange information and various scan sequences between operation console 12, computer 13 switches the operation of sequence memory circuit 10, reloads memory, operates the image reconfiguration by using various data sent from A/D converter 11, then outputs reconfiguration image data to display unit 9. Sequence information may be stored and written by computer 13 as required to the memory of sequence memory circuit 10.

Figure 2:
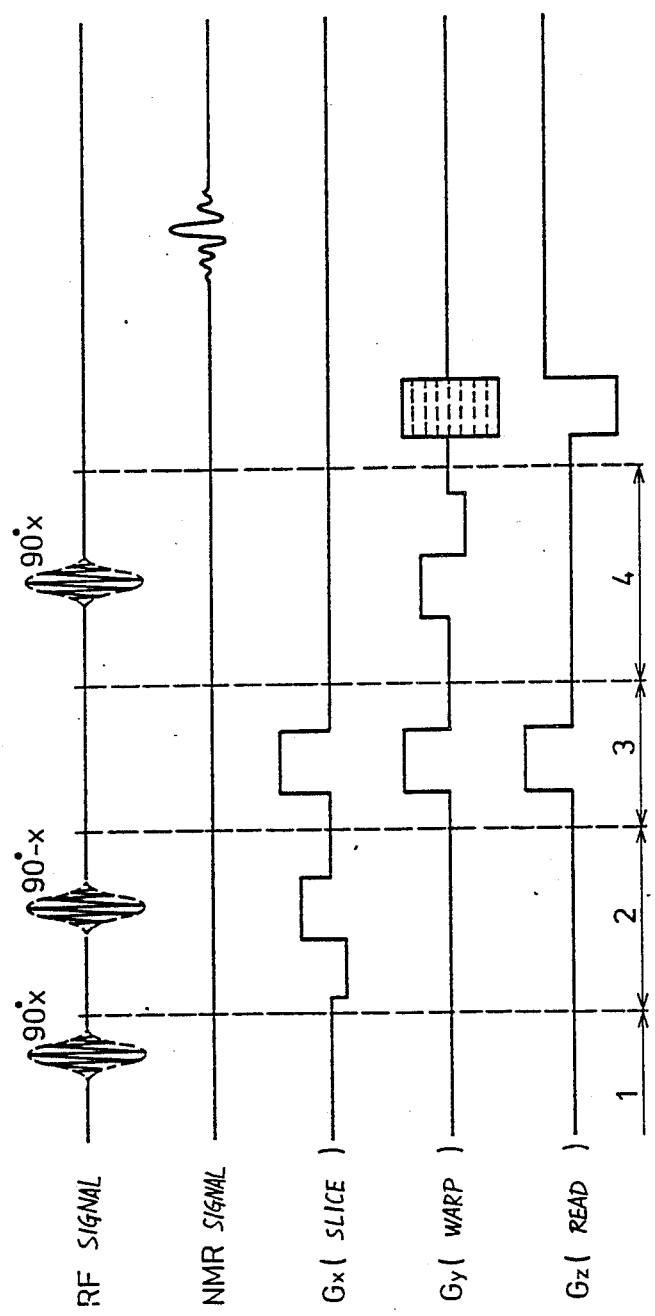
FIGS. 2 through 4 explain the operation of the application mode of this invention.
Figure 3:
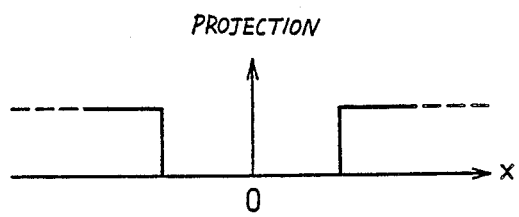
Figure 4:
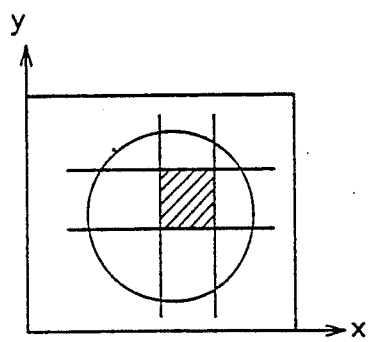
Figure 5:
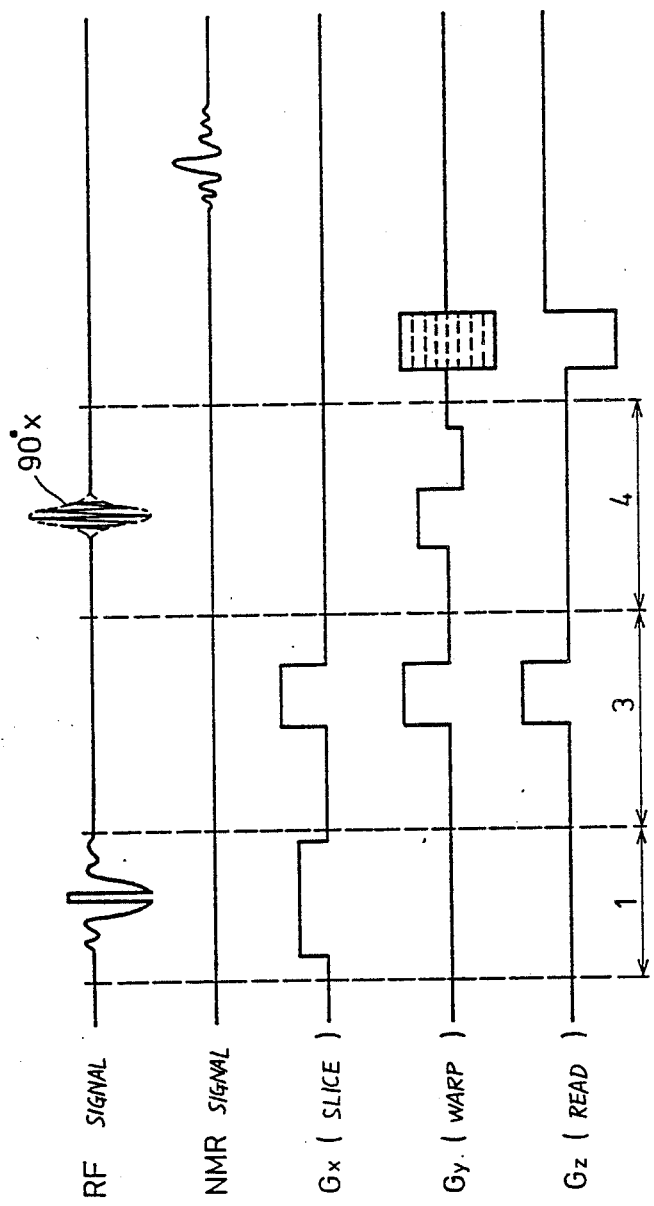
FIG. 5 explains the operation of another application mode of this invention.

The configuration described above operates in the preferred application mode according to the selective excitation method provided by this invention as follows: Sequence memory circuit 10 executes scanning in the sequence shown in FIG. 2, for example, according to instructions issued by the computer 13. In FIG. 2, $G_x$, $G_y$, and $G_z$ indicate gradient magnetic field signals. First, a $90°_x$RF pulse is generated in a state having no applicable gradient magnetic field to excite every spin in the entire range that can be excited by this pulse (that can be reached by the transmission coil power) (Section 1). After prephasing with gradient magnetic field x, a $90°_{-x}$RF pulse and gradient magnetic field x are simultaneously applied to only return the desired spins selected in direction x to a non-excited (Section 2). FIG. 3 shows projection in direction x at this time. The projection is opposite that of normal selective excitation. If individual gradient magnetic fields (spoilers) of x, y, and z (having a large amplitude) are applied in this state (Section 3), these spoilers cause a uniform dispersion of phases of individual spins already in an excited state. In this case, no RF signal is transmitted outside and that the area enters a state in which no excitation RF pulses are accepted (spoiled). Such a state is maintained for the duration determined by vertical relaxation time $T_1$. In such a state, the following imaging is done according to the spin/warp method, for example. In other words, a $90°_x$RF pulse and a gradient magnetic field signal in direction y enable selective excitation in direction y (Section 4). The $90°_x$RF pulse at this time is used for non-selective excitation in direction x. Note that because the area spoiled in Section 3 is not to be excited again, only an overlapped portion of an unspoiled area in direction x in Section 3 and a selectively excited area in direction y in Section 4 is excited. Therefore, selective excitation is done in a area limited in the two directions (x and y) as shown in FIG. 4. From Section 4 on, a sequence based on the conventional spin warp method is effected using direction z as the read axis and the data required to reconfigure an image is collected. Moreover, after the spoil operation, any method of data collection may be adopted without being restricted to the above mentioned spin/warp method. Therefore, if using a method to generate a spin echo signal by inverting a gradient magnetic field or Free Induction Decay signal, selective excitation can be done in an area having two limited directions. FIG. 5 shows another preferred application mode according to the selective excitation method provided by this invention. The characteristic of this sequence shown in FIG. 5 is to use a signal having an envelope expressed by function delta(x)-sinc(x) (composed by using the sinc and delta functions and simultaneously applying this excitation RF signal and gradient magnetic field x) as the excitation RF signal in Section 1.

Figure 6:
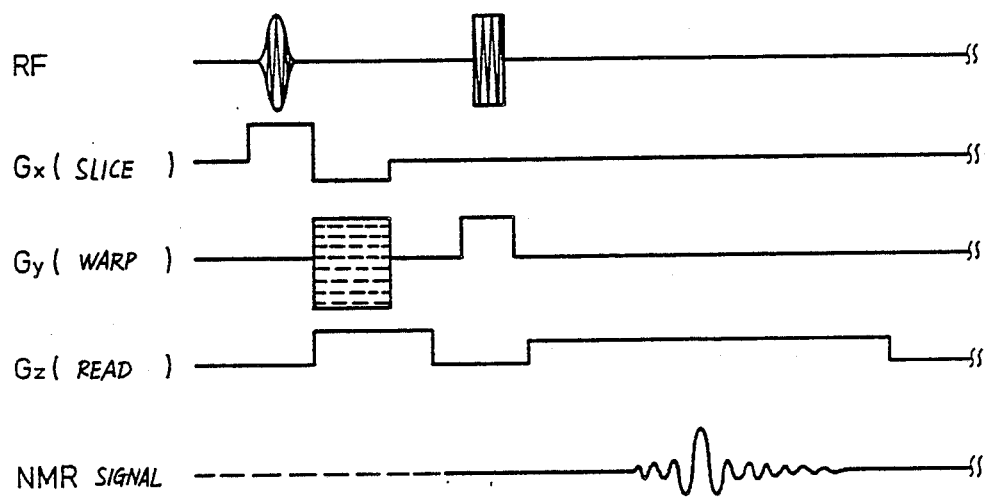
FIGS. 6 and 7 explain operation according to the prior art procedures.
Figure 7:
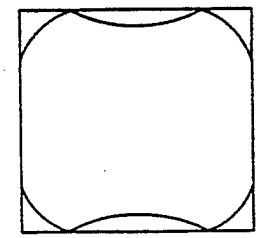

This means that using the Fourier transformation of delta(x)-sinc(x) obtains 1-rect(x). Actually, instead of using the delta function, a pulse waveform with a minimized width is used, and the difference from the slice thickness (determined by the sinc function) is to be excited. According to this method, an operation equivalent to those in Sections 1 and 2 in FIG. 2 can be done simultaneously. Thereafter, spoil operations are done similarly as shown in of FIG. 2 according to the spin warp method or by using another sequence. If the method provided by this invention is combined with a prior art bidirectional selective excitation method as shown in FIG. 6, selectivity can be applied in the third direction, and selective excitation in three directions can be achieved.

We have thus far described the preferred application mode of this invention. This invention may be easily applied in other specific forms by persons possessing the related technical knowledge in fields to which this invention pertains without departing from the spirit or essential characteristics of the following claims.

We claim:

1. A selective excitation method for NMR imaging, comprising the steps of
    applying an excitation RF signal to excite nuclear spins in a non-scan area of a subject;
    spoiling an excited nuclear spin area with a gradient magnetic field;
    collecting magnetic resonance data from an unspoiled scan area by applying an excitation RF signal and gradient magnetic field to the subject after the spoiling of the excited nuclear spin.

2. The method of claim 1, wherein, first, an excitation RF signal is applied, without applying a gradient magnetic field; then, second, exciting the spins to return to an original direction; and third, applying an excitation RF signal while applying a gradient magnetic field in one direction.

3. The method of claim 1, wherein a gradient magnetic field is applied in one direction while applying an excitation RF signal having an envelope expressed as a function delta (x)-sinc(x) composed of sinc and delta functions.

* * * * *